United States Patent
Sato et al.

(10) Patent No.: US 7,241,511 B2
(45) Date of Patent: Jul. 10, 2007

(54) RUBBER-BASED COMPOSITE MATERIAL AND THE RUBBER ARTICLE USING THE SAME

(75) Inventors: Kenji Sato, Kodaira (JP); Shinichiro Sugi, Kodaira (JP); Nobuko Kato, Kodaira (JP); Kenichi Sugimoto, Kodaira (JP)

(73) Assignee: Bridgestone Corporation, Tokyo (JP)

( * ) Notice: Subject to any disclaimer, the term of this patent is extended or adjusted under 35 U.S.C. 154(b) by 142 days.

(21) Appl. No.: 10/515,651

(22) PCT Filed: May 14, 2003

(86) PCT No.: PCT/JP03/06007

§ 371 (c)(1),
(2), (4) Date: Nov. 24, 2004

(87) PCT Pub. No.: WO03/099554

PCT Pub. Date: Dec. 4, 2003

(65) Prior Publication Data
US 2006/0024485 A1 Feb. 2, 2006

(30) Foreign Application Priority Data
May 24, 2002 (JP) ............................. 2002-150582

(51) Int. Cl.
*B32B 9/00* (2006.01)
*B32B 19/00* (2006.01)
*B32B 27/00* (2006.01)
*B32B 27/12* (2006.01)

(52) U.S. Cl. ...................... 428/689; 428/701; 428/702; 428/423.9; 428/938; 442/394

(58) Field of Classification Search ................ 442/394, 442/399, 379; 428/832.1, 548, 418, 423.9, 428/689, 492, 701, 702
See application file for complete search history.

(56) References Cited

U.S. PATENT DOCUMENTS

2003/0015272 A1* 1/2003 Teratani et al. ............. 152/406

FOREIGN PATENT DOCUMENTS

| JP | 61-146870 A | 4/1986 |
|----|----|----|
| JP | 62-087311 A | 4/1987 |
| JP | 2003-13357 A | 1/2003 |
| JP | 2003-80633 A | 3/2003 |
| WO | WO 02/02356 | * 1/2002 |

* cited by examiner

*Primary Examiner*—Lynda Salvatore
(74) *Attorney, Agent, or Firm*—Sughrue Mion, PLLC

(57) ABSTRACT

A rubber based composite material having a rubber composition and, adhered thereto, a reinforcing material having a coating film containing a metal or a metal compound capable of reacting with sulfur formed on the surface of the material, characterized in that the oxygen content in the coating film increases toward the reinforcing material in the thickness direction.

9 Claims, No Drawings

RUBBER-BASED COMPOSITE MATERIAL AND THE RUBBER ARTICLE USING THE SAME

TECHNICAL FIELD

The present invention relates to a rubber-based composite material comprising a rubber and a reinforcing material adhered to each other, and the rubber article using the same, and in particular, to a rubber-based composite material excellent both in initial adhesiveness and adhesion durability under a wide range of vulcanization condition and the rubber article using the same.

BACKGROUND ART

Reinforcing materials such as organic fiber codes and steel codes have been widely used hitherto in rubber-based composite materials for use in tire, belt, hose, and the like. In such a case, it is very important that the rubber and the reinforcing material bind to each other firmly, from the viewpoints of the durability and the morphological stability of product. For example, in composite materials of an organic fiber code and a rubber, the organic fiber code is commonly dipped in an resorcin-formaldehyde condensate/latex (RFL) adhesive for improvement in adhesion between the two, while in composite materials of a steel code and a rubber, the steel code is plated in various ways for improvement in adhesion between the two.

In this manner, there are a variety of ways to improve the adhesiveness between a rubber composition and a reinforcing material, and such composite materials higher in adhesiveness should ideally be superior both the initial adhesiveness and the adhesion durability.

SUMMARY OF THE INVENTION

However, there existed a problem that increase in the adhesion durability between a rubber composition and a reinforcing material is often accompanied with decrease in initial adhesiveness under certain conditions while increase in the initial adhesiveness under wider vulcanization conditions leads to decrease in the adhesion durability.

Considering the circumstances above, an object of the invention is to provide a rubber-based composite material excellent both in initial adhesiveness and adhesion durability under a wide range of vulcanization condition.

The present invention provides a rubber-based composite material produced by adhering a rubber composition to a reinforcing material having a film containing a metal or a metal compound capable of reacting with sulfur formed on the surface of the material, characterized in that the oxygen concentration in the film increases toward the reinforcing material in the thickness direction.

The film may be a laminate of two or more layers different in the composition ratio of metal and oxygen, and the ratio of oxygen concentration to metal concentration in the layer at the reinforcing material side of the film is preferably 1.5 times or more larger than the ratio of oxygen concentration to metal concentration in the layer at the film surface side.

The reinforcing material according to the present invention is preferably an organic fiber, and more preferably, the organic fiber comprises at least one of polyester and polyamide. In addition, the reinforcing material of the invention is preferably a non-woven fabric.

The film is preferably formed by physical vapor deposition (PVD) or chemical vapor deposition (CVD), and the physical vapor deposition (PVD) method is more preferably a magnetron sputtering method.

The metal or metal compound in the film is preferably cobalt or cobalt oxide.

In addition, the invention includes rubber articles using the rubber-based composite material above.

The invention described above provides a rubber-based composite material having a rubber composition and a reinforcing material adhered to each other that is excellent both in initial adhesiveness and adhesion durability under a wide range of vulcanization conditions.

This application claims benefit of and priority to Japanese Patent Application No. 2002-150582, filed on May 24, 2002, which is incorporated herein by reference in its entirety for all purposes.

DESCRIPTION OF THE PREFERRED EMBODIMENT

Hereinafter, the present invention will be described in detail.

The reinforcing material for use in the rubber-based composite material according to the invention is not particularly limited, and examples thereof include metals or the alloys thereof such as iron, nickel, copper, tin, zinc, and lead; natural polymer fibers such as cotton, rayon, and cellulose; synthetic polymer fibers such as polyester, polyvinyl alcohol, polyimide, and polyamide; known nonmetal materials such as plastics and ceramics; and combinations of the metal or alloy and the nonmetal material above. Preferable is a natural or synthetic polymer fiber, and particularly preferable is a polyester or polyamide fiber. The polyester fibers include polyethylene terephthalate fiber, polyethylene-2,6-naphthalate fiber, polybutylene terephthalate fiber, and the like. The polyamide fibers include aliphatic polyamide fibers represented by various nylons; aromatic polyamide fibers represented by p-diaminobenzene terephthalamide, p-diaminobenzene isophthalamide, and o-diaminobenzene-2,6-naphthylamide; and the like.

The shape of the reinforcing material is not particularly limited and may be freely determined according to applications, and examples thereof include non-woven fabric, woven fabric, code, and the like, or alternatively, a fiber filament having the film according to the invention may be blended to the rubber composition as it is.

Non-woven fabrics have advantages not only as a reinforcing material but also as a light-weight material, and thus application thereof to a variety of rubber articles that demand rigidity and durability has been studied, and application of the non-woven fabrics to the rubber-based composite materials that did not contain such a reinforcing material is highly expected, as it allows expansion of the freedom in designing and improvement in durability of such materials. The non-woven fabrics are webs produced, for example, by carding, papermaking, air laying, melt blowing, or spun bonding, without twisting or weaving a number of fiber bundles. Favorable examples of the methods of bonding the fibers in web except the melt blowing or spun bonding method include heat-sealing method, binder method, and water jet entangling or needle punch method of entangling fibers with running water or needle. In particular, non-woven fabrics produced by the water jet entangling or needle punch method of entangling fibers with running water or needle, melt blowing method, and spun bonding method are preferable. In addition, a multilayer structured filament fiber in which a material differs from an adjoining layer may also be used. Further, composite fibers may also be used such as core-in-sheath structure having different materials in the core and sheath, a radial pattern, or in the shape of petals, layers, or the like.

The non-woven fabric preferably has a structure that allows impregnation of the rubber composition into the space among the fiber filaments and formation of a continuous layer between the filament fibers and the rubber composition over a relatively longer range in a wider area. Accordingly, the diameter or the maximum width of the filament fiber is preferably in the range of 0.1 to 100 μm and more preferably 0.1 to 50 μm. However, the shape of the cross-section may be or may not be circular and the fiber may be a hollow fiber having a cavity inside.

The length of the filament fiber is preferably 8 mm or more and more preferably 10 mm or more. If the length of filament fiber is less than 8 mm, it is more difficult to entangle the fiber filaments sufficiently and thus the resulting web does not have the strength required for reinforcement layer.

The basis weight of the non-woven fabric (weight per 1 $m^2$) is preferably in the range of 10 to 300 g and more preferably 10 to 200 g. If the basis weight of non-woven fabric is less than 10 g, the non-woven fabric provide a web having a more irregular surface, it is not preferable as it become difficult to maintain the uniformity of fiber dispersion, leading to fluctuation in the strength, rigidity, and elongation at break of the rubber/non-woven fabric composite after vulcanization. Alternatively, if it is more than 300 g, the rubber composition penetrates less easily into the non-woven fabric, though it might depends on the fluidity of rubber composition, which is not favorable from the viewpoints of the peeling resistance of rubber/non-woven fabric composite and the like.

In the invention, a film containing a metal or metal compound reactive with sulfur is formed on the reinforcing material surface. The film is formed so that the oxygen concentration in the film increases in the thickness direction toward reinforcing material.

The metal or metal compound reactive with sulfur is not particularly limited if it is a material that reacts with sulfur in the rubber composition in a vulcanization reaction during rubber vulcanization and examples thereof include metals such as Co, Cu, Zn, Cr, Al, Ag, Ni, Pb, Ti, and W, or alloys of two or more of these metals; the oxides, nitrides, carbides, sulfides, and sulfates thereof; and the like. In particular, metals, alloys, or the oxides thereof such as Co, Co/Cr alloy, Cu/Zn alloy, and Cu/Al alloy are preferably used. Co and Co oxide are more preferable (see, Japanese Patent Application Laid-Open Nos. 62-87311, 62-246278, and 1-290342).

Here, the compounds such as oxides, nitrides, and carbides may be or may not be prepared stoichiometrically. The ratio of the metal element is preferably higher than the stoichiometric value.

The method of forming a film containing the metal or metal compound above on the reinforcing material surface is not particularly limited, and may be a liquid-phase deposition method such as plating method and sol-gel method, but the film is preferably formed by a gas-phase deposition method such as physical vapor deposition (PVD) or chemical vapor deposition (CVD). The gas-phase deposition methods have advantages that they do not cause environmental pollution as they employ no solvent and the clogging often encountered in liquid-phase deposition when a non-woven fabric is used.

Examples of the PVD methods include vacuum vapor deposition such as resistance-heating vapor deposition, electron beam-heating vapor deposition, and laser-heating vapor deposition; sputtering such as direct current sputtering, high-frequency sputtering, magnetron sputtering, ECR sputtering, and ion beam sputtering; ion plating such as high-frequency ion plating and cluster ion beam; molecular beam epitaxy; laser abrasion; and the like. Alternatively, examples of the CVD methods include thermal CVD methods such as atmospheric pressure CVD and reduced pressure CVD; plasma CVD methods such as direct current plasma CVD, high-frequency plasma CVD, microwave plasma CVD, and ECR plasma CVD; organic metal CVD; and optical CVD methods. Among these methods, the sputtering method is preferably used and a magnetron sputtering method is used particularly preferably in the invention.

The first reason for the advantage of using the sputtering method is that it allows low-temperature film forming on the reinforcing material surface. The second reason is that the operational pressure during film forming is normally relatively high at $5\times10^{-2}$ to $1\times10^1$ Pa and thus the film formation is less vulnerable to the influence by the out gas from the non-woven fabric or the like. The third reason is that the particles sputtered from the target are possibly scattered by an environmental gas such as argon (Ar) or the like before directly reaching the reinforcing material surface, causing "wrap-around". Namely, by the "wrap-around", a film is preferably formed on the area not directly facing the target and the area hidden on the reinforcing material having a complicated shape.

During sputtering, oxygen, which is a reactive gas, is introduced as needed to the environmental gas, an inert gas such as Ar, He, Ne, or Kr. A nitrogen gas such as $N_2$ or $NH_3$ or a hydrocarbon gas such as $CH_4$ may be added to the gas. The mixing ratio of the inert gas to the reaction gas (volume ratio in supply gas) is 100/0 to 0/100 (inert gas/reaction gas) and preferably 100/0 to 20/80.

In addition, a bias voltage may be applied to the reinforcing material as needed. In such a case, either a direct current or an alternate current may be used as the bias current. When an alternate current is used, the alternate current has preferably a pulsed wave or a radio frequency wave (rf). When a direct current is used, the voltage is preferably in the range of −1 to +1 kV.

The gas pressure is not particularly limited if sputtering is possible, but preferably $1\times10^{-2}$ to $5\times10^2$ Pa, more preferably $5 \times 10^{-2}$ to $1 \times 10^1$ Pa. The frequency of the power source (supplied to the target) may be that of the known direct or alternate current. Generally, a direct current or radio-frequency (rf) power source is used, but a pulsed power source may be used instead. So-called ionized magnetron sputtering that activates particles during sputtering by generating inductive plasma between the target and the base material may also be used.

In order to provide the film with an inclination in oxygen concentration by using the film-forming method above, the film may be formed by controlling the film-forming conditions such as the film-forming time, ratio of gas supply, and the like, or may be formed by laminating two or more layers different in the ratio of the composition of metal and oxygen therein. In order to make the oxygen concentration in the film increase in the thickness direction toward reinforcing material, the oxygen concentration of the layer at the reinforcing material side should be larger than that of the layer at the film surface side. To maximize the advantageous effects of the invention, the ratio of oxygen concentration to metal concentration in the layer at the reinforcing material side of the film is preferably 1.5 times or more larger than the ratio of oxygen concentration to metal concentration in the layer at the film surface side.

The thickness of the film thus formed is not particularly limited, but is preferably 0.6 to 20 nm and more preferably 1 to 10 nm.

The surface of the reinforcing material is preferably cleaned thoroughly as needed before film forming, and a plasma treatment, ion implantation, ion irradiation, thermal treatment or the like may be performed additionally after film forming for improvement in the surface state, reactivity, internal stress, and the like of the film. Solvent washing or a combination of solvent washing and a discharge treatment may be preferably used as the cleaning method. In addition, several cleaning methods may be used in combination for improving the cleaning effect.

The rubber composition for use in the invention is not particularly limited and favorable examples thereof include rubber compositions commonly used as tire, belt, hose, and the like. Accordingly, the rubber composition may contain a natural rubber or a synthetic rubber as the primary component, and additionally a vulcanizing agent, vulcanization accelerator, reinforcing material, antioxidant, softener, or the like as needed.

In adhering a reinforcing material having the film above formed to a rubber composition, the reinforcing material is first covered with an unvulcanized rubber composition. Methods of covering the reinforcing material with the unvulcanized rubber composition include the methods of pressing a sheeted unvulcanized rubber composition on one face or both faces of the reinforcing material by a press or roll; applying a liquid containing an unvulcanized rubber composition dissolved or dispersed in a solvent onto the reinforcing material; and the like.

After the reinforcing material is covered with the unvulcanized rubber composition, the composite is then vulcanized. The optimal condition for vulcanization is selected suitably according to the size, shape, composition, and the like of reinforcing material and unvulcanized rubber composition which are the subject of vulcanization.

The rubber-based composite materials according to the invention obtained in this manner may be preferably used for rubber articles that demand both superior initial adhesiveness and adhesion durability, and examples thereof include tire, belt, hose, antivibration material, antivibration rubber, rubber crawler, and the like, although the invention is not particularly limited thereto.

EXAMPLES

Hereinafter, the present invention will be described with reference to Examples.

Examples 1 and 2 and Comparative Examples 1 and 2

The surface (both surfaces) of a non-woven fabric (fiber: PET [Tetoron (®), manufactured by Toray Industries, Inc.], physical properties: fineness 6.6 Dtex, specific density: 1.38, strength: 5.3 g/Dtex, breaking elongation: 50%, fiber diameter: 25 μm, basis weight: 60 g/m², and thickness: 5 mm) was cleaned by a low-pressure plasma method under the condition shown in the following Table 1, and then subjected to sputtering by using a Co target (purity: 3N) under the condition also shown in Table 1, to form a film of Co and the oxide thereof on one face. The average electric densities during cleaning and film forming in the Table were electric powers supplied to per 1 m³ of non-woven fabric. Separately, in Comparative Examples, the non-woven fabric of Example 1 was processed under the conditions shown in Table 1 to form a Co film or the oxide film on one face.

TABLE 1

| | Surface treatment condition | | | | | | | |
|---|---|---|---|---|---|---|---|---|
| | Cleaning condition | | | | Film-forming condition | | | |
| | Gas | Pressure (Pa) | Electric density (W/m²) | Period (sec) | | Gases and the ratio | Pressure (Pa) | Electric density (kW/m²) | Film-forming period (sec) |
| Example 1 | Ar | 100 | 600 | 300 | 1st layer | Ar/O₂ = 50/0 | 0.7 | 11.5 | 20 |
| | | | | | 2nd layer | Ar/O₂ = 40/10 | 0.7 | 11.5 | 40 |
| Example 2 | Ar | 100 | 600 | 300 | 1st layer | Ar/O₂ = 50/0 | 0.7 | 11.5 | 20 |
| | | | | | 2nd layer | Ar/O₂ = 35/15 | 0.7 | 11.5 | 40 |

TABLE 1-continued

| | Surface treatment condition | | | | | | | |
|---|---|---|---|---|---|---|---|---|
| | Cleaning condition | | | | Film-forming condition | | | |
| | Gas | Pressure (Pa) | Electric density (W/m$^2$) | Period (sec) | Gases and the ratio | Pressure (Pa) | Electric density (kW/m$^2$) | Film-forming period (sec) |
| Comparative Example 1 | Ar | 100 | 600 | 300 | 1$^{st}$ layer Ar/O$_2$ = 50/0 | 0.7 | 11.5 | 60 |
| Comparative Example 2 | Ar | 100 | 600 | 300 | 1$^{st}$ layer Ar/O$_2$ = 40/10 | 0.7 | 11.5 | 60 |

The element ratios of Co and O of the surface side and a non-woven fabric side of each film formed under the conditions above were determined by using an XPS (Quantum 2000, manufactured by Alpack Phi Co., Ltd.). Results are summarized in Table 2.

TABLE 2

Co/O element ratio

| | | Co/O Element ratio |
|---|---|---|
| Example 1 | Surface side | 95/5 |
| | Non-woven fabric side | 85/15 |
| Example 2 | Surface side | 95/5 |
| | Non-woven fabric side | 80/20 |
| Comparative Example 1 | Surface side | 95/5 |
| | Non-woven fabric side | 95/5 |
| Comparative Example 2 | Surface side | 85/15 |
| | Non-woven fabric side | 85/15 |

Each of the non-woven fabrics formed under the conditions shown in Table 1 was sandwiched with two rubber sheets of 5 mm in thickness having the composition shown in Table 5, and the composite was vulcanized under each conditions of 145° C. for 10 minutes and 145° C. for 30 minutes, to give a rubber-based composite material. Then, each rubber-based composite material was cooled at room temperature and the initial adhesiveness thereof was evaluated immediately. In addition, each rubber-based composite material vulcanized under the condition of 145° C. for 30 minutes was deteriorated in an oxygen atmosphere and left to stand until the water adhered on the surface is sufficiently evaporated, and then the adhesion durability of each composite material was evaluated. These results are summarized in Tables 3 and 4.

The evaluation of the initial adhesiveness and the adhesion durability was performed by peeling the rubber sheet of both sides under the condition of room temperature and a tension speed of 300 mm/min by using Autograph (manufactured by Shimadzu Corp.) and visually observing the rubber adhesion area on the fiber of the non-woven fabric which appeared in the fracture side. Adhesiveness was rated in 10 levels, from level 10 when the rubber adhesion area rate is 100% to level 1 when it is 10%.

TABLE 3

Evaluation of initial adhesiveness

| Vulcanization condition | 145° C. for 10 minutes Adhesiveness | 145° C. for 30 minutes Adhesiveness |
|---|---|---|
| Example 1 | 8 | 9 |
| Example 2 | 8 | 9 |
| Comparative Example 1 | 8 | 9 |
| Comparative Example 2 | 3 | 8 |

TABLE 4

Evaluation of adhesion durability

| Vulcanization condition | 145° C. for 30 minutes Adhesiveness |
|---|---|
| Example 1 | 6 |
| Example 2 | 7 |
| Comparative Example 1 | 2 |
| Comparative Example 2 | 6 |

TABLE 5

Composition of the rubber composition used in Examples

| Component | Parts by weight | Product name |
|---|---|---|
| Natural rubber | 100 | — |
| Carbon black | 60 | — |
| Stearic acid | 2 | — |
| Zinc white | 5 | — |
| Antioxidant | 2 | Nocrac 6C, Ouchishinko Chemical Industrial Co., Ltd. |
| Vulcanization accelerator | 1 | Nocceler NS-P, Ouchishinko Chemical Industrial Co., Ltd |
| Sulfur | 2 | — |

As apparent from Tables 3 and 4, the rubber-based composite materials of Examples 1 and 2 showed an excellent initial adhesiveness and an excellent adhesion durability under any vulcanization conditions, because the film was formed on the surface of non-woven fabric which is reinforcing material so that the oxygen concentration therein increased in the thickness direction toward the non-woven fabric surface. In contrast, the rubber-based composite material of Comparative Example 1 has an initial adhesiveness similar to those of Examples in any of the vulcanization conditions but was inferior in adhesion durability to those of Examples. Alternatively, the rubber-based composite material of Comparative Example 2 was superior in adhesion durability but inferior in the initial adhesiveness under the vulcanization condition of 145° C. for 10 minutes, indicating that it does not show a sufficiently high initial adhesiveness under a wide range of vulcanization condition.

As described above, the present invention provides a rubber-based composite material excellent both in initial adhesiveness and adhesion durability under a wide range of vulcanization condition.

It should be understood that the foregoing description of the invention is intended merely to be illustrative of the preferable embodiments by way of example only and that other modifications, embodiments, and equivalents may be apparent to those skilled in the art without departing from its spirit.

The invention claimed is:

1. A rubber-based composite material comprising a rubber composition and, adhered thereto, a reinforcing material having a film containing oxygen and a metal or a metal compound capable of reacting with sulfur formed on the surface of the material, characterized in that the oxygen concentration in the film increases toward the reinforcing material in the thickness direction and the film is a laminate of two or more layers different in ratio of the composition of metal and oxygen.

2. The rubber-based composite material according to claim 1, characterized in that the ratio of oxygen concentration to metal concentration in the layer at the reinforcing material side of the film is preferably 1.5 times or more larger than the ratio of oxygen concentration to metal concentration in the layer at the film surface side.

3. The rubber-based composite material according to claim 1, characterized in that the reinforcing material comprises an organic fiber.

4. The rubber-based composite material according to claim 3, characterized in that the organic fiber comprises at least one of polyester and polyamide.

5. The rubber-based composite material according to claim 1, characterized in that the reinforcing material is a non-woven fabric.

6. The rubber-based composite material according to claim 1, characterized in that the film is formed by physical vapor deposition (PVD) or chemical vapor deposition (CVD).

7. The rubber-based composite material according to claim 6, characterized in that the physical vapor deposition (PVD) method is a magnetron sputtering method.

8. The rubber-based composite material according to claim 1, characterized in that the metal or metal compound is cobalt or cobalt oxide.

9. A rubber article comprising the rubber-based composite material of claim 1.

* * * * *